US011935221B2

United States Patent
Nickkholgh et al.

(10) Patent No.: US 11,935,221 B2
(45) Date of Patent: Mar. 19, 2024

(54) USER INTERFACE FOR JUDGMENT CONCERNING QUALITY CLASSIFICATION OF DISPLAYED ARRAYS OF COMPONENT CARRIERS

(71) Applicant: AT&S (Chongqing) Company Limited, Chongqing (CN)

(72) Inventors: Amin Nickkholgh, Tehran (IR); Seok Kim Tay, Singapore (SG)

(73) Assignee: AT&S (Chongqing) Company Limited, Chongqing (CN)

( * ) Notice: Subject to any disclaimer, the term of this patent is extended or adjusted under 35 U.S.C. 154(b) by 317 days.

(21) Appl. No.: 17/247,074

(22) Filed: Nov. 27, 2020

(65) Prior Publication Data

US 2021/0158508 A1 May 27, 2021

(30) Foreign Application Priority Data

Nov. 27, 2019 (CN) .......................... 201911182370.0

(51) Int. Cl.
 *G06T 7/00* (2017.01)
 *G01N 21/95* (2006.01)
 *G01N 21/956* (2006.01)
(52) U.S. Cl.
 CPC ....... *G06T 7/0004* (2013.01); *G01N 21/9501* (2013.01); *G01N 21/956* (2013.01); *G06T 2207/30148* (2013.01)
(58) Field of Classification Search
 CPC ......... G06T 7/0004; G06T 2207/30148; G06T 2207/30141; G06T 2207/30152; G06T 7/0008; G06T 2207/30164; G01N 21/9501; G01N 21/956; H05K 13/083; G06K 9/6267
 See application file for complete search history.

(56) References Cited

U.S. PATENT DOCUMENTS

| | | | |
|---|---|---|---|
| 6,046,421 A | 4/2000 | Ho | |
| 6,477,266 B1 * | 11/2002 | Asar | G01N 21/95607 382/147 |
| 6,621,566 B1 | 9/2003 | Aldrich et al. | |

(Continued)

FOREIGN PATENT DOCUMENTS

| | | |
|---|---|---|
| CN | 1571923 A | 1/2005 |
| CN | 1677095 A | 10/2005 |

(Continued)

OTHER PUBLICATIONS

Office Action in Application No. 201911182370.0; pp. 1-14; dated Sep. 17, 2020; China National Intellectual Property Administration; Beijing, China.

(Continued)

*Primary Examiner* — Roy M Punnoose
(74) *Attorney, Agent, or Firm* — Robert A. Blaha; Smith Tempel Blaha LLC

(57) ABSTRACT

A method of processing component carriers includes supplying a plurality of arrays, each comprising a plurality of component carriers, to a human operator for optical inspection, displaying a respective array on a display, and providing a user interface enabling the human operator to input a judgment concerning a quality classification of a displayed array without a mandatory manual handling of the array by the human operator.

19 Claims, 6 Drawing Sheets

(56) References Cited

U.S. PATENT DOCUMENTS

| | | | | |
|---|---|---|---|---|
| 6,970,588 | B1 * | 11/2005 | Komatsu | G06T 7/001 |
| | | | | 382/141 |
| 7,177,458 | B1 | 2/2007 | Savareigo et al. | |
| 7,925,073 | B2 | 4/2011 | Hakim et al. | |
| 2003/0202703 | A1 | 10/2003 | Ogi | |
| 2010/0134137 | A1 | 6/2010 | Kida | |
| 2013/0037526 | A1 | 2/2013 | Noy et al. | |
| 2013/0125044 | A1 | 5/2013 | Saylor et al. | |
| 2013/0170733 | A1 | 7/2013 | Leu | |
| 2014/0017822 | A1 * | 1/2014 | Sakai | H01L 21/6836 |
| | | | | 438/15 |
| 2014/0230991 | A1 | 8/2014 | Piantoni et al. | |
| 2015/0138540 | A1 | 5/2015 | Newman et al. | |
| 2015/0162299 | A1 | 6/2015 | Keller | |
| 2016/0270274 | A1 | 9/2016 | Toyoda | |
| 2019/0035696 | A1 | 1/2019 | Lin et al. | |
| 2019/0164270 | A1 | 5/2019 | Wardell et al. | |
| 2019/0254173 | A1 | 8/2019 | Chang et al. | |
| 2020/0387824 | A1 * | 12/2020 | Kelsey | B32B 41/00 |

FOREIGN PATENT DOCUMENTS

| | | | | |
|---|---|---|---|---|
| CN | 101378649 | A | 3/2009 | |
| CN | 101652705 | A | 2/2010 | |
| CN | 103185730 | A | 7/2013 | |
| CN | 103369952 | A | 10/2013 | |
| CN | 103813767 | A | 5/2014 | |
| CN | 104428649 | A | 3/2015 | |
| CN | 105979706 | A | 9/2016 | |
| CN | 106153639 | A | 11/2016 | |
| CN | 106404796 | A | 2/2017 | |
| CN | 207742299 | U | 8/2018 | |
| CN | 108663383 | A | 10/2018 | |
| CN | 108846202 | A | 11/2018 | |
| CN | 109013405 | A | 12/2018 | |
| CN | 208207914 | U | 12/2018 | |
| CN | 110132960 | A | 8/2019 | |
| CN | 110160959 | A | 8/2019 | |
| CN | 110455822 | A | 11/2019 | |
| CN | 110473806 | A | 11/2019 | |
| IN | 105849881 | A | 8/2016 | |
| JP | H07117571 | B2 * | 12/1995 | |
| JP | 2002031606 | A * | 1/2002 | G01N 21/956 |
| JP | 2007017311 | A * | 1/2007 | G01N 21/956 |
| JP | 2008083044 | A | 4/2008 | |
| KR | 101777547 | B1 | 9/2017 | |
| WO | 99/16010 | A1 | 4/1999 | |
| WO | WO-2015053710 | A1 * | 4/2015 | B65B 35/30 |
| WO | 20160005965 | A1 | 1/2016 | |
| WO | 20170041964 | A1 | 3/2017 | |
| WO | 20170077532 | A1 | 5/2017 | |

OTHER PUBLICATIONS

Tessens, L.; Communication in Application No. EP 20 20 9974.3; pp. 1-11; dated Apr. 13, 2021; European Patent Office; 80298; Munich, Germany.

Hu, Y.; Apply Optical Coherence Tomography to Non-destructive Detection on Coating Quality of Automotive Electronics; pp. 1-70, Soochow University, Dec. 2016. (English Abstract on pp. ii-iii).

Anoop K.P.; A Review of PCB Defect Detection Using Image Processing; pp. 188-192; International Journal of Engineering and Innovative Technology (IJEIT); vol. 4, Issue 11, May 2015.

Office Action in Application 202110585933.1; pp. 1-13; Dec. 8, 2023; China National Intellectual Property Administration; No. 6, Xitucheng Lu, Jimenqiao Haidian District, Beijing City, 100088, China.

* cited by examiner

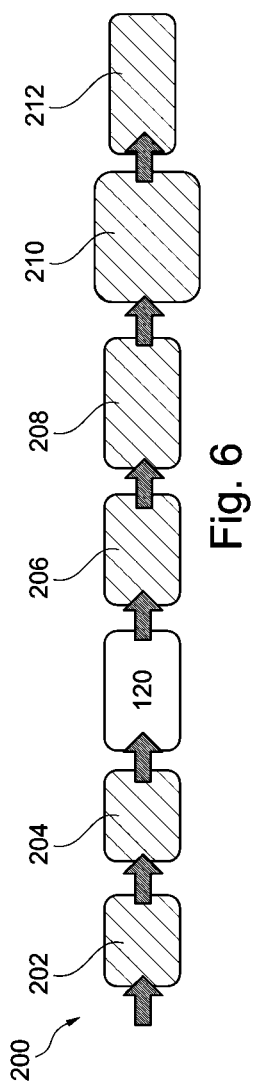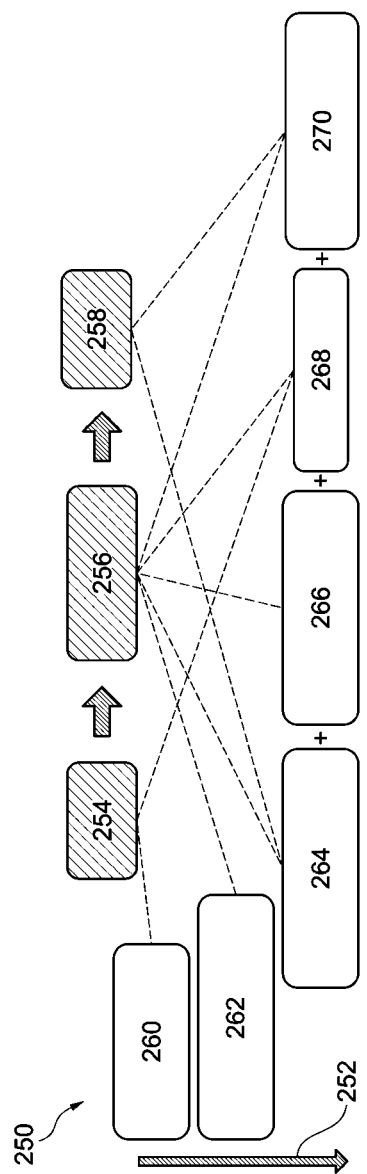

USER INTERFACE FOR JUDGMENT CONCERNING QUALITY CLASSIFICATION OF DISPLAYED ARRAYS OF COMPONENT CARRIERS

CROSS-REFERENCE TO RELATED APPLICATIONS

This application claims the benefit of the filing date of the Chinese Patent Application no. 201911182370.0 filed 27 Nov. 2019, the disclosure of which is hereby incorporated herein by reference.

TECHNICAL FIELD

Embodiments of the invention relate to a method of processing component carriers, an apparatus for optical inspection of component carriers of arrays, a computer-readable medium, and a program element.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Inspection of manufactured component carriers of an array is conventionally carried out by human operators who manually handle the arrays for said purpose. In particular during back-end processing, component carriers in an array are however prone to damage. Furthermore, the conventional optical inspection by human operators is cumbersome.

SUMMARY

There may be a need to process component carriers on array level with high yield and reasonable effort.

According to exemplary embodiments of the invention, a method of processing component carriers, an apparatus for optical inspection of component carriers of arrays, a computer-readable medium, and a program element according to the independent claims are provided.

According to an exemplary embodiment of the invention, a method of processing component carriers is provided, wherein the method comprises supplying a plurality of arrays, each comprising a plurality of component carriers, to a human operator for optical inspection, displaying a respective array on a display, and providing a user interface enabling the human operator to input a judgment concerning a quality classification of a displayed array. In particular, said quality classification may be made without a mandatory manual handling of the array by the human operator.

According to another exemplary embodiment of the invention, an apparatus for optical inspection of component carriers of arrays is provided, wherein the apparatus comprises a supply unit configured for supplying a plurality of arrays, each comprising a plurality of component carriers, to a human operator for optical inspection, a display configured for displaying a respective array to the human operator, and a user interface configured for enabling the human operator to input a judgment concerning a quality classification of a displayed array. In particular, said quality classification may be made without a mandatory manual handling of the array by the human operator.

According to still another exemplary embodiment of the invention, a program element (for instance a software routine, in source code or in executable code) is provided, which, when being executed by a processor (such as a microprocessor or a CPU), is adapted to control or carry out a method having the above-mentioned features.

According to yet another exemplary embodiment of the invention, a computer-readable medium (for instance a CD, a DVD, a USB stick, an SD card, a floppy disk or a hard disk, or any other (in particular also smaller) storage medium) is provided, in which a computer program is stored which, when being executed by a processor (such as a microprocessor or a CPU), is adapted to control or carry out a method having the above mentioned features.

Data processing which may be performed according to embodiments of the invention can be realized by a computer program, that is by software, or by using one or more special electronic optimization circuits, that is in hardware, or in hybrid form, that is by means of software components and hardware components.

OVERVIEW OF EMBODIMENTS

In the context of the present application, the term "component carrier" may particularly denote any support structure which is capable of accommodating one or more components thereon and/or therein for providing mechanical support and/or electrical connectivity and/or optical connectivity and/or thermal connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "array" may particularly denote a still integrally connected body composed of multiple preforms of component carriers. For instance, such an array may originally form part of a panel, which may be an even larger format, compared to an array, used during manufacturing component carriers. In the process of manufacturing component carriers, a panel is processed and then separated in arrays. The arrays may be further processed and may then be separated into individual component carriers. For instance, an array may comprise six component carriers.

In the context of the present application, the term "optical inspection" may particularly denote a visual monitoring of component carriers of an array carried out by a human being, also denoted as human operator. During such an optical inspection, it may be inspected as to whether individual component carriers or the array as a whole can be considered as passing the optical inspection test or failing the optical inspection test. In the latter case, a respective component carrier or entire array may be classified defective. For instance, such defects may be erroneously connected traces which should be electrically isolated from each other, erroneously separate traces which should be electrically connected with one another, defects in a core on which electrically conductive traces are formed, etc.

In the context of the present application, the term "display" may particularly denote an electronic hardware unit electrically displaying an image of an array or of individual component carriers to a user. For instance, the displayed image may be a photo or camera image of the array or part thereof or may be a schematic image related in an abstract way to the array or its properties. Thus, the display may show the component carriers or arrays as physical bodies, and/or may show virtual images of the arrays or component carriers.

In the context of the present application, the term "user interface" may particularly denote a (unidirectional or preferably bidirectional) communication interface between an apparatus and a human operator. Via the user interface, image information and control options may be shown to a human operator. Via the user interface, the human operator may be enabled to input control commands, for instance by touching a touchscreen, by typing commands in a keypad and/or by operating a joystick or other control device.

In the context of the present application, the term "human based judgement" may particularly denote the result of an optical inspection of an image of an array or individual component carriers by a human operator indicative of a quality class in which the human operator classifies a respective array or component carrier. By monitoring the array or component carriers on the display, the human operator may come to the conclusion that a respective component carrier or array is intact, defective, or needs repair. Other classes are possible, such as "non-repairable" or "classification requires further analysis".

In the context of the present application, the term "without a mandatory manual handling of the array by the human operator" may particularly denote the fact that the method and apparatus of an embodiment can be carried out or operated in such a way that any physical touching of the array or component carrier by the human operator during the optical inspection is either fully disabled or is rendered merely optional and exceptional. Thus, a corresponding method and apparatus may operate in such a way that the optical inspection procedure as well as the quality classification procedure can be carried out without the necessity that the human operator manually handles or touches the array or the component carriers. In exemplary embodiments, it may or may not be possible that the human operator exceptionally requests manual handling of the array or component carriers, for instance for an in-depth analysis in an exceptional case. However, the default mode of the method and apparatus is that the entire optical inspection is carried out without manual handling or touching of array and component carriers by a human operator.

According to an exemplary embodiment of the invention, a system for optically inspecting component carriers of an array is provided, wherein the optical inspection is possible without the need of manually touching or handling the array or component carriers by a human operator. In contrast to this, the optical inspection is carried out by displaying the array or component carriers on an electronic display for visual access to the human operator. The human operator may then analyze the quality of individual component carriers or the array as a whole on the electronic display. On the basis of this visual inspection, the human operator may then operate a user interface of the system so as to input the (for instance human based) judgement concerning the quality of the array or component carriers. This may be accomplished by correspondingly operating a user interface. Thus, a highly reliable optical inspection may be carried out in a rapid way and without the risk that a manual handling or touching of arrays or component carriers by a human operator damages the array or component carriers, for instance by scratching, triggering corrosion, contamination with foreign material, etc. Furthermore, inspecting arrays and component carriers on a display or screen provides the operator with an improved support for making the quality decision. For instance, it may be possible for the human operator to zoom critical portions of the array or component carrier on the display without the need of touching, compare critical portions with a quality evaluation made during previous manufacturing processes or stages, etc. Thus, the reliability of the human based quality assessment may be further refined.

In the following, further exemplary embodiments of the method, the apparatus, the computer-readable medium, and the program element will be explained.

In an embodiment, the method comprises providing an option for a human operator for exceptionally manually handling the array on exceptional request. In exceptional cases, it may be difficult for a human operator to unambiguously classify an array or component carrier based on a corresponding image on the display only. In order to further increase the reliability and flexibility of the system, it may be exceptionally possible that, on specific requests of a human operator, the supply unit may supply the array or component carrier to the human operator for handling and direct inspection. However, such an opportunity may only be involved optionally in the process, while a default mode is a quality classification by a human operator based on information provided on the display, without touching or otherwise manually handling the array or component carrier. For instance, at least 90% of the arrays may be classified without involving handling of the array by a human operator.

In an embodiment, the method comprises making an automated proposal concerning the quality classification. Correspondingly, the apparatus may comprise a quality classification proposal unit configured for making a proposal concerning quality classification to be displayed to the human operator on the display. Advantageously, the system may automatically process the image data and make a proposal concerning the quality classification to the human operator. The human operator can then accept or overrule said proposal. However, by providing a proposal to the human operator, clear cut cases of passing, failing or repairing of arrays or component carriers may be classified in a simplified and accelerated way.

In an embodiment, the method comprises displaying the automated proposal concerning the quality classification to the human operator. By displaying the proposal concerning the quality classification on the display, preferably overlaid or superposed with an image of the respective array or component carrier, accepting or rejecting the proposal of the machine by the human operator can be significantly simplified.

In an embodiment, the method comprises carrying out the quality classification to classify a respective individual component carrier or an entire array as "pass", i.e. having passed successfully the optical inspection. Alternatively, the method may comprise carrying out the quality classification to classify a respective individual component carrier or an entire array as "fail", i.e. having failed to successfully pass the optical inspection. Further alternatively, the method may comprise carrying out the quality classification to classify a respective individual component carrier or an entire array as "repairable" or "to be repaired". Repairing may convert classification of an array or component carrier having failed to pass the optical inspection into a classification that the repaired array or component carrier has passed the optical inspection. The classification of an array or individual component carrier as having passed the optical inspection, having failed the optical inspection or having failed the optical inspection but being acceptable after repair, is a simple and straightforward quality classification scheme being very intuitive for a human operator.

In an embodiment, the method comprises displaying an image of the array on the display, in particular a zoomed image of the array. By zooming in on the array or individual critical component carriers on the display, the basis for the decision concerning quality classification made by the human operator assisted by the user interface and display may be rendered even more accurate. It may happen that the judgement concerning the quality of an array or component carrier requires a zoomed image which can be provided quickly and with low effort in an electronic way. Thus, the mentioned opportunity further improves the reliability of the decision making and may thereby increase the yield.

In an embodiment, the method comprises displaying on the display an image of the array in which at least one component carrier is marked as "identified to be defective in a previous processing stage". By providing the human operator on the display with an indication which one or more component carriers of an array has already been identified as defective in a previous processing stage simplifies and eases the quality classification by a user in a later present processing stage. It may for instance be dispensable in a present manufacturing stage to review or analyze in depth component carriers which have already been identified as defective in previous processing stages (in which for instance lower layers of a component carriers have been analyzed). Thus, taking this measure prevents double work and thereby increases the efficiency.

The previous processing stage may be a previous manufacturing stage and/or the present processing stage may be a present manufacturing stage. The array in the previous manufacturing stage may have been physically different from the array in the present manufacturing stage, for example because layers have been modified and/or added to the array.

In an embodiment, the method comprises displaying on the display an image (for instance a further image) of the array in which at least one component carrier is marked as "automatedly proposed to be defective in a present processing stage". Displaying one or more component carriers of an array on the display which have been identified by an automatic failure detection system as potentially defective in a present manufacturing or processing stage may simplify the work of a human operator. The human operator may focus on the critical component carriers which have been identified as potentially defective by the automatic failure detection system of the present processing stage. However, a user may accept or refuse a corresponding proposal made by the system to classify a specific component carrier as defective.

In an embodiment, the method comprises displaying on the display said image of the array in which at least one component carrier is marked as identified to be defective in the previous processing stage overlaid or superposed with said further image of the array in which at least one component carrier (the same or another one) is marked as automatedly proposed to be defective in the present processing stage (see for instance FIG. 4). Highly advantageously, the display may overlay or superpose an image of the array in which individual component carriers have been marked as defective in a previous processing stage together with an image of the array indicating potentially defective component carriers of the array as identified in the present processing stage (in particular by the automatic failure detection system). Advantageously, component carriers of the array which have already been identified as defective in one or more previous processing stages may be displayed visually distinguishable (for instance in another color or with another symbol) from component carriers which are determined as potentially defective by the automatic failure detection system in the present processing stage. In an optically highly intuitive way, a user may thus see which component carriers need detailed analysis (in particular those which have been proposed as defective in the present processing stage), which component carriers need no additional analysis (in particular those which have been finally classified as defective in a previous processing stage), and which component carriers need for instance summary analysis (for instance those which have been considered as "pass" in the previous processing stage and which are proposed to be classified as "pass" in the present processing stage by the automatic failure detection system). Such a highly intuitive system reduces the risk of failure and accelerates the automatic inspection by the human operator to obtain high yield at a low rate of erroneous classification.

In an embodiment, the optical inspection is carried out at a remote location, which differs from a processing location of the plurality of arrays, in particular from a location where the displayed array is repaired, if defective and repairable. For example, the processing location may be the location of a factory or plant, where the plurality of arrays are at least partially manufactured. The remote location may be outside the factory or plant. The distance between the remote location and the processing location may be at least 1 km, in particular at least 10 km, in particular at least 100 km. The remote location and the processing location may be in different countries and/or in different continents. There may be an optional transfer of information from the processing location to the remote location. The display and/or the human operator may be at the remote location. Any action triggered by the human operator may be carried out at the processing location, for example at least one of a handling of the array, a further processing of the array, a repair of the array, and a disposal of a component carrier of the array or of the entire array.

In an embodiment, the method comprises displaying on the display at least one of the group consisting of an array identifier (such as lot number, manufacturing time, etc.), error or defect codes (for instance scratch, foreign material, missing electric connection, erroneous electric connection, etc.), and a control field (for instance for controlling loading and/or unloading of an array for exceptional manual handling, controlling a zoomed illustration of an array or part thereof, etc.). By showing also such additional items on the same display on which also the image of the array is displayed, it is sufficient for a human operator to only look on one screen to carry out the optical inspection.

In an embodiment, the method comprises carrying out the quality classification so as to indicate a type of defect among a number of predefined types of defects. Providing a list of frequent defects, from which an identified defect may be selected, may streamline the process of defect handling.

In an embodiment, the method comprises marking, in particular laser marking, of a respective component carrier or an entire array based on the quality classification. After having made the inspection and the judgement, a corresponding component carrier or array may be marked in accordance with the result of this classification as a basis for a subsequent handling. For instance, a cross may be laser engraved in a respective component carrier or array which is defective and cannot be repaired. This can be done for instance by laser processing. Marking a component carrier or array with a corresponding marker allows the provision of a physical identifier allowing to identify erroneously manufactured component carriers in a visually intuitive way.

In an embodiment, the method comprises carrying out the optical inspection during back-end processing. In the context of the present application, the term "back-end processing" may particularly denote a processing of the array after separation of a panel into arrays and before separation of the array into individual component carriers. In particular, an interface between front-end processing and back-end processing may be formation of a solder mask or a surface finish process. It has been found that during back-end processing, a human-based optical inspection and judgement as a basis for classification of the component carriers can be carried out particularly advantageously supported by a smart display and user interface eliminating the mandatory need of touching arrays of component carriers by human operators. Such a combined human-machine-based optical inspection architecture has turned out to increase efficiency, reliability and yield during back-end processing.

In an embodiment, the quality classification proposal unit is configured for making the proposal by applying artificial intelligence (AI). In the context of the present application, the term "artificial intelligence" may particularly denote a system using elements of artificial intelligence such as neural networks, self-learning or self-adaptive systems, fuzzy logic, etc. By artificial intelligence, an inspection result of the automatic optical inspection may be reviewed and its relevance for the quality of the component carriers to be manufactured may be assessed. Artificial intelligence ability of the system may help an operator to judge in a more reliable way if a unit (i.e. an array or a component carrier) needs to be considered as defective or not. This A function may at the same time reduce many of probable false defects. Therefore, more accurate judgement with significantly improved inspection speed may be achieved.

In an embodiment, the quality classification proposal unit equipped with artificial intelligence is configured for learning based on historical (for instance human-based) judgments, in particular under consideration of a comparison of historical apparatus-proposed judgments with historical (for instance human-based) judgments. Hence, learning on the basis of a sufficiently high number of decisions taken by human operators (in particular 1000 cases, more particularly at least 10000 cases) allows to adjust the weights of a self-adaptive or self-learning system in such a way that, for future decisions, the performance of an automatic judgement can be made at least as reliable as that of a human being. In particular, such self-learning or self-adaptation may be highly efficient when comparing historical or past human-based classification events with machine-based classification events.

In an embodiment, the user interface is configured for enabling the human operator to selectively accept or overrule each proposal made by the quality classification proposal unit. The final decision about the quality classification can thereby be on the side of the human operator rather than on the automatic system. It has turned out that, by applying artificial intelligence, an automatic system may make in many cases a meaningful proposal for a quality classification. However, it is still more reliable to leave the final decision to the human operator. By taking this measure and enabling the human operator to overrule the proposal made by the system may thus further increase the yield and reduce fault decisions or classifications.

In an embodiment, the display is an input device such as a touchscreen for enabling the human operator to operate, in particular exclusively, via the touchscreen. For instance, the touchscreen may include input elements allowing the human operator to directly carry out a classification on the display so that it is dispensable that the operator has to compare images on the display with the physical array or component carrier. Also taking this measure reduces the percentage of wrong classifications. However, the input device does not need to be a touchscreen, but can also be any other input surface. For instance, it may be advantageous to have buttons instead of a touch device. Thus, a touchscreen is just one example. The input device can also be a controller (such as a remote control) instead of an on-screen interaction directly on the display.

In an embodiment, the method comprises carrying out the optical inspection by handling the arrays in a touchless way. In particular, an embodiment enables a 100% touchless array handling. This may significantly increase yield in the back-end section by reducing additional defects in inspection process.

In an embodiment, the method comprises carrying out the optical inspection in the framework of, embedded in or in combination with a traceability system. In such a traceability system, each array and/or each component carrier may be provided with a readable code structure (for instance a QR code) assigned to a related data set stored in a database for identifying each array and/or each component carrier by an assignment between a respective code structure and a respective data set. Thus, manufacture of the component carriers (for instance printed circuit boards) obtained by separating the readily processed array may be refined using a traceability system. In terms of such a traceability system, stored information about processed layer structures may be encoded in a code structure assigned to a respective layer structure. For instance, in a software-based manner, stored information about previously manufactured layer structures may be processed in such a way that a presently processed layer structure can be manufactured under consideration of previous layer structures. Thus, the entire system may be aligned and manufactured more precisely. An exemplary embodiment thus relates to an optical inspection method which uses a traceability process (for instance providing an electronic mapping capability) to speed up the final inspection process and prevent an operator to erroneously mark a good component carrier as a scrapped unit, or vice versa. Applying electronic mapping data (for instance in XML format) may be a highly advantageous feature of the final inspection system and may bring the whole inspection history of that specific array on a monitor or a display and to a human operator to judge. Using an apparatus equipped with such a unique traceability feature may also prohibit double scrap issues during final inspection.

In an embodiment, the judgement is at least one of a human-based judgement and a machine-based judgement. Preferably, the judgement the operator enters may be human based. Additionally or alternatively, it may also be machine-based (in particular from another machine and/or algorithm), yet be entered by the operator.

In an embodiment, the component carriers comprise a stack of at least one electrically insulating layer structure and at least one electrically conductive layer structure. In the context of the present application, the term "layer structure"

may particularly denote a continuous layer, a patterned layer or a plurality of non-consecutive islands within a common plane. A layer structure may be electrically insulating and/or electrically conductive. For example, the component carriers may be a laminate of the mentioned electrically insulating layer structure(s) and electrically conductive layer structure(s), in particular formed by applying mechanical pressure and/or thermal energy. The mentioned stack may provide plate-shaped component carriers capable of providing a large mounting surface for further components and being nevertheless very thin and compact.

In an embodiment, the component carriers are shaped as a plate. This contributes to the compact design, wherein the component carriers nevertheless provide a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carriers formed on the basis of the array is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene.

In an embodiment, each of the above mentioned electrically insulating layer structures comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Delaware, U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, each of the above mentioned electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier further comprises an electronic component mounted on and/or embedded in the component carrier material, in particular in the stack. For instance, the electronic component may be a radiofrequency semiconductor chip configured for emitting and/or receiving radiofrequency signals via the wiring structures and being electrically coupled with the electrically conductive wiring structures. Hence, the electronic component may be configured for executing a radio frequency application, in particular a radio frequency application involving frequencies above 1 GHz.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof.

In an embodiment, the component carriers are laminate-type component carriers. In such an embodiment, the component carrier is a compound of multiple layer structures which are stacked and connected together by applying a pressing force and/or heat.

After processing interior layer structures of the component carriers, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 6 illustrates a flowchart of a method of processing component carriers according to an exemplary embodiment of the invention.

FIG. 7 illustrates a flowchart of a method of processing component carriers according to another exemplary embodiment of the invention.

DETAILED DESCRIPTION OF THE ILLUSTRATED EMBODIMENTS

Figure 1:
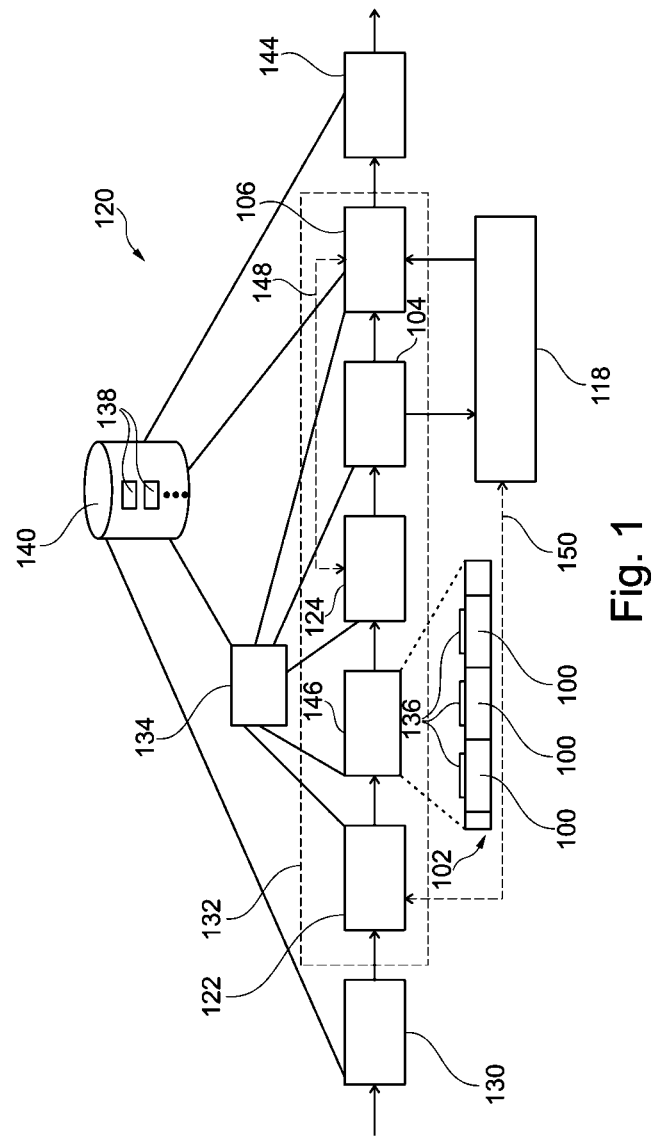
FIG. 1 schematically illustrates an apparatus for optical inspection of component carriers of an array during processing component carriers according to an exemplary embodiment of the invention.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a system and method are provided enabling an inspection of arrays comprising multiple component carriers or preforms thereof without a need that an operator manually handles the arrays. In contrast to this, a quality classification judgement is made by the human operator preferably only via a display and a user interface displaying the array and component carrier on the basis of which a decision has to be made. The human operator may then visually inspect the array displayed via the display and may operate the user interface for making a quality classification of the individual component carriers or preforms thereof, or of the array as a hole. While the machine may make a defect proposal, the final decision concerning quality classification may be up to the human operator. While there may be an option to exceptionally handle arrays on request of the human operator, the method and system may be carried out and operated without the mandatory need of a user touching and handling the arrays or component carriers. Consequently, the risk of damage (for instance scratching) of the preforms of the component carrier may be reduced. Furthermore, by involving artificial intelligence during the machine-based proposal concerning the presence or absence of defects of a respective component carrier, a more reliable quality classification can be carried out. Since the human operator may accept or reject said machine-based proposals, this information is meaningful learning material for an artificial intelligence system of the apparatus for making more and more meaningful proposals.

Thus, an exemplary embodiment of the invention provides a smart automated final inspection system. Application cases of manufacturing component carriers on panel level and separating the panel into arrays may involve a high number of component carriers per strip or array. Thus, the requirements for an at least semi-automated final inspection system may be increased. According to an exemplary embodiment of the invention, such a system may be fully automated with a loader/unloader system to prevent additional defects on the component carriers. Furthermore, such a system may also improve the human naked eye inspection capabilities by providing additional optical enhancements. At the same time, the final optical inspection may be equipped with a smart software-based system which may help a human operator to make a reliable and objective judgement of the quality of the component carriers, so that human errors may be reduced.

In particular advantageous may be the combination of such a semi-automatic final optical inspection with an electronic mapping or traceability system in which the various arrays displayed on a display of the system may be provided with a unique identifier, allowing to trace the arrays and individual component carriers along an entire manufacturing process.

It may be in particular advantageous to implement artificial intelligence in such a system to help a human operator in a final inspection process. Integrating such a concept in an electronic mapping or traceability system may allow full traceability in order to better monitor the entire manufacturing process. Advantageously, a touchless system may be provided improving back-end testing of component carriers yield significantly.

According to an exemplary embodiment, a smart automated final inspection system may be provided which increases reliability and efficiency by reducing human-based failure issues while simultaneously focusing on human capability of failure detection.

Conventionally, a fully manual handling and preparation in quality classification of component carriers on array level may cause certain defects such as scratching. Furthermore, a higher rate of human errors may occur due to a bigger number of component carriers per strip shaped array which may involve a higher risk of wrong judgment. Another conventional issue is the lack of a properly working electronic tracking system of tracing component carriers during manufacture. In conventional array inspection systems involving manual handling of arrays of component carriers by a human operator, errors may also occur as a result of a limited and discrete visual access to the component carriers or details thereof during inspection.

According to exemplary embodiment of the invention, an improved optical inspection of component carriers on array level may be provided in which at least part of the above-mentioned and/or other shortcomings may be overcome by rendering a manual inspection of the arrays optional rather than mandatory, i.e. by providing an inspection architecture which does not necessarily rely on a manual handling of the arrays by human operators. In one embodiment, exceptional manual handling of an array by human operators may be allowed only exceptionally on exceptional request. In another embodiment, manual handling of arrays by a human operator may be even entirely disabled.

In particular, an electronic mapping concept may be implemented which may be advantageously accompanied by an XML (Extensible Markup Language) file capability. Moreover, it may be possible to enhance reliability of human operator judgment abilities by combining them with a smart artificial intelligence (AI) function. Furthermore, a touchless array handling and testing architecture may be provided. Such an automated touchless handling may advantageously increase yield. Also, as a result of an enhanced judgement using artificial intelligence, yield and accuracy may be increased, and inspection time may be decreased. Moreover, full traceability may be supported through an electronic mapping functionality which may increase efficiency, and which may simplify and accelerate judgment. Furthermore, it may be possible to provide on demand quality reports. Exemplary embodiments may also contribute to the reduction or even minimization of human errors for arrays with a high number of component carriers per array, which will further increase yield and accuracy.

Exemplary embodiments of the invention may be applicable in particular for high density integration (HDI), modified semi-additive processing (mSAP) and integrated circuit (IC) based products, i.e. in particular for all manufacturing procedures implementing a final inspection stage. More specifically, exemplary embodiments may be advantageous for any kind of module products with small unit size and high number of units per strip or array. Exemplary embodiments of the invention may provide improvements concerning monitoring in a back-end production line and may also contribute to estimating trends of up-coming tasks. An advantageous aspect of exemplary embodiments is the implementation of the concept of electronic mapping in combination with an enhanced judgement function based on artificial intelligence (AI). In contrast to conventional approaches, exemplary embodiments may provide enhanced judgment abilities due to the implementation of AI. In particular, exemplary embodiments may decrease any potential process related defect and human misjudgment and may therefore increase overall yield during manufacture of component carriers.

FIG. 1 illustrates a block diagram of an apparatus 120 for optical inspection of component carriers 100 of an array 102 during processing component carriers 100 according to an exemplary embodiment of the invention.

Apparatus 120 serves for an optical inspection and a corresponding quality classification of component carriers 100 which still form integral part of an array 102 during processing the same in a manufacturing plant. The apparatus 120 comprises a supply unit 122 configured for supplying a plurality of arrays 102 received from a previous processing stage 130 to a schematically illustrated human operator 118 for optical inspection in a present processing stage 132. After said optical inspection, the arrays 102 may be forwarded to a subsequent processing stage 144 for further processing.

Furthermore, a display 104 is provided which is configured for displaying an image of a respective array 102, detected by optical detection unit 146, to the human operator 118. Additionally, apparatus 120 comprises a user interface 106 configured for enabling the human operator 118 to input a judgment concerning a quality classification of a displayed array 102 without the need to mandatorily manually handle and touch the array 102 by the human operator 118.

Moreover, apparatus 120 includes a quality classification proposal unit 124 configured for making an automated proposal concerning quality classification. Said proposal may be displayed to the human operator 118 on the display 104. Advantageously, the quality classification proposal unit 124 may be configured for making the proposal by applying artificial intelligence (AI). An artificial intelligence module of the quality classification proposal unit 124 may be configured for learning based on historical judgments, preferably under consideration of a comparison of historical apparatus-proposed judgments with historical judgments.

The user interface 106 may be configured for enabling the human operator 118 to selectively accept or overrule the machine-made proposal. Furthermore, the display 104 may comprise a touchscreen for enabling the human operator 118 to operate fully via the touchscreen.

A processor 134 or control unit of the apparatus 120 may control overall operation of the apparatus 120 as a whole. The processor 134 may have access (in particular read and write access) to a database 140. In particular, such a processor 134 or control unit may be configured to carry out a method as described in the following.

In terms of said method of processing component carriers 100, the plurality of arrays 102, each comprising a plurality of component carriers 100, are supplied to a human operator 118 for optical inspection. The method may further comprise displaying a respective array 102 on display 104. Moreover, user interface 106 may enable the human operator 118 to input a judgment concerning a quality classification of a displayed array 102 without a mandatory manual handling of the array 102 by the human operator 118. Additionally, the method may comprise providing the option to human operator 118 for exceptionally manually handling the array 102 on exceptional request by the human operator 118. It may also be possible to make an automated proposal concerning the quality classification as decision-making support for simplifying a quality classification made by the human operator 118. Furthermore, the method comprises displaying the automated proposal concerning the quality classification to the human operator 118 on display 104. For instance) it may be possible in the context of the optical inspection to carry out the quality classification to classify a respective individual component carrier 100 or an entire array 102 as "pass", "fail", or "to be repaired". It may also be possible to display, on display 104, a zoomed image of the array 102 to further assist the human operator 118 to assess the quality of an array 102 or an individual component carrier 100. Carrying out the quality classification may be accomplished by indicating a type of defect among a number of predefined types of defect, in particular when an array 102 or a component carrier 100 is classified as "fail" or "to be repaired". The method may also comprise laser marking a respective component carrier 100 or an entire array 102 based on the quality classification, in particular in accordance with the classification as "fail". The optical inspection may be carried out during back-end processing, i.e. on array level. During executing the method, it may be advantageously possible to carry out the optical inspection by handling the arrays 102 in a touchless way. Advantageously, the method may carry out the optical inspection in functional cooperation with a traceability system in which each array 102 and/or each component carrier 100 is provided with a readable code structure 136 (such as a QR code) assigned to a related data set 138 stored in database 140. Reading out a code structure 136 and querying database 140 for finding a best match with one of the data sets 138 may allow identifying each array 102 and/or each component carrier 100 via the assignment between a respective code structure 136 and a respective data set 138.

According to the apparatus 120 shown in FIG. 1, arrays 102 comprising a plurality of still integrally connected preforms of component carriers 100 may be supplied by supply unit 122 from previous processing stage 130 to present processing stage 132. As shown in the schematic illustration of the array 102 in FIG. 1, each component carrier 100 or preform thereof and/or each array 102 (not shown) may be provided with a respective code structure 136 such as a QR code (or any other machine-identifiable code structure, for instance visually, haptically, thermally and/or electrically identifiable). Each code structure 136 is assigned to a corresponding data set 138 in database 140 which can be accessed by control unit or processor 134, as well as of certain entities of previous processing stage 130, present processing stage 132 and subsequent processing stage 144. The code structures 136 have been formed on and/or attached to a respective pre-form of a component carrier 100 or to the entire array 102 during the manufacturing process. For instance, a respective code structure 136 may be a unique QR code formed by patterning a corresponding copper layer laminated to a layer stack forming the respective component carrier 100. By detecting a respective code structure 136, for instance by optical detection unit 146, may allow determining information about a respective preform of a component carrier 100 by accessing in database 140 an assigned data set 138, being assigned to an individual code structure 136. Thus, the illustrated system of quality classification of preforms of component carriers 100 may be integrated in a traceability system. The optical detection unit 146 may comprise a camera capturing an image of the array 102 and processing a corresponding image. This processing may be carried out on the basis of, on the one hand, identifying the array 102 or an individual preform of a component carrier 100 by correlation of respective code structure 136 and a respective data set 138 in the database 140. Furthermore, it is also possible that the image of the array 102 captured by the optical detection unit 146 may be processed so as to display it on display 104, as described below in further detail. A corresponding processing of image data detected by optical detection unit 146 may also be made as a basis for a proposal concerning a quality classification of a respective array 102 or preform of a component carrier 100 by quality classification proposal unit 124, as described below as well.

During operation of the apparatus 120, a respective array 102 is supplied by supply unit 122 automatically from previous processing stage 130 to present processing stage 132. An image of the array 102 is captured by optical detection unit 146. This image is used for identifying the panel 102 or the individual preforms of component carriers 100 based on detecting the respective code structure 136 and assigning it to a respective data set 138 in database 140. Furthermore, the image of the array 102 may be supplied to the quality classification proposal unit 124 as a basis for making a proposal concerning quality classification of the array 102 or its component carriers 100. Quality classification proposal unit 124 may carry out automatic image recognition to determine various features of the array 102. Furthermore, the quality classification proposal unit 124 may use artificial intelligence for making the quality decision. For instance, the quality proposal made by quality classification proposal unit 124 may be that a specific component carrier 100 is classified as "pass", "fail" or "repair". Passing means that the respective component carrier 100 is accepted as meeting a specification. Failing means that a respective component carrier 100 may be considered to fail meeting a specification. Repair means that it is possible to repair the respective component carrier 100, presently not meeting the specification, to meet the specification after repair.

Figure 3:
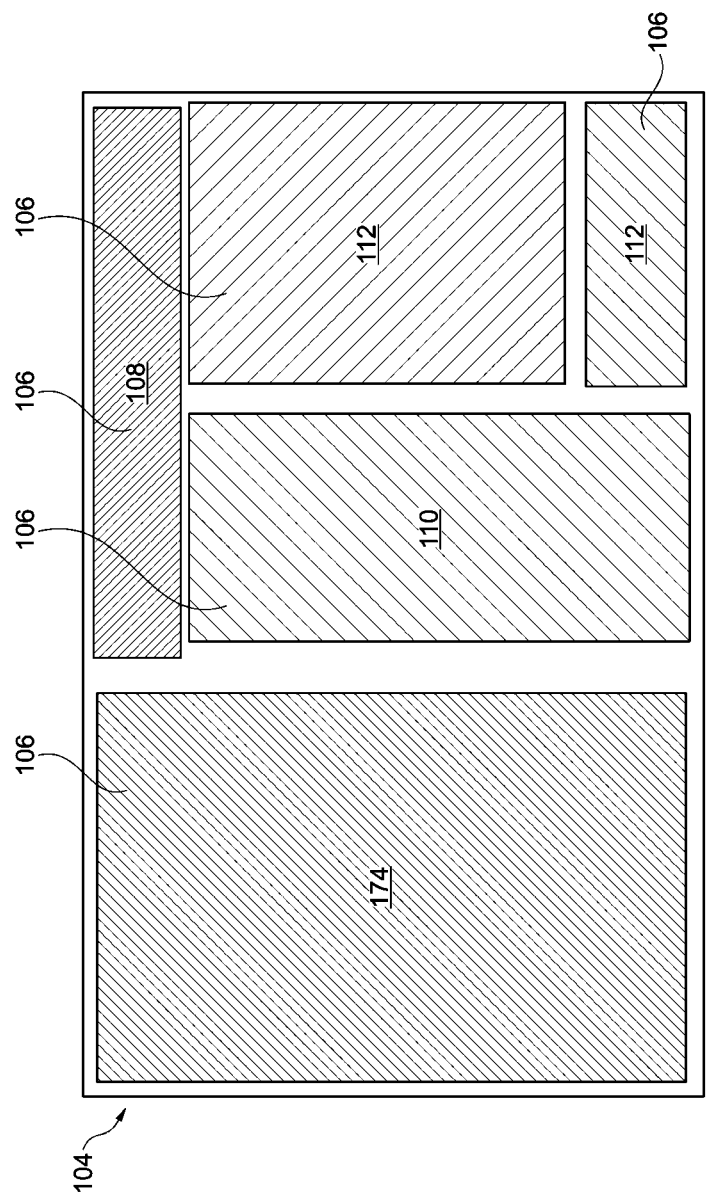
FIG. 3 illustrates a display and a user interface of an apparatus for optical inspection of component carriers of an array during processing component carriers according to an exemplary embodiment of the invention.
Figure 4:
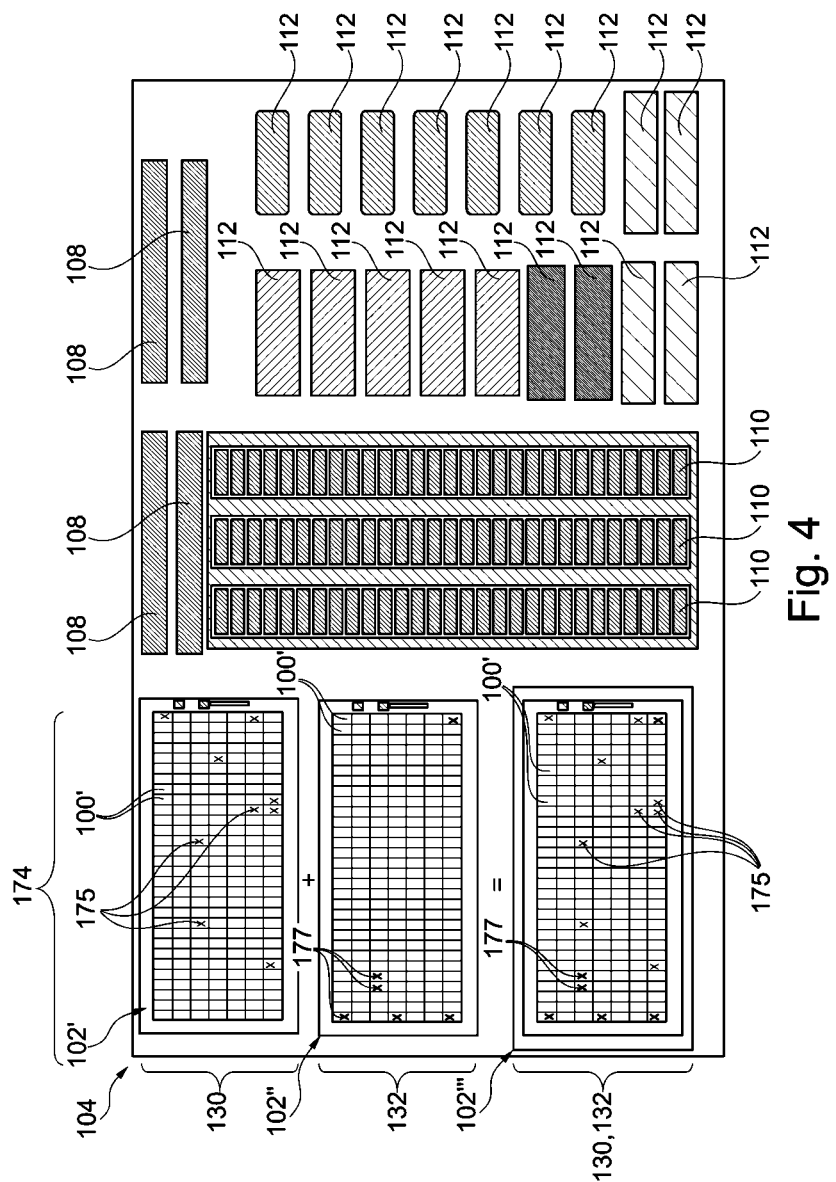
FIG. 4 illustrates in detail a display and a user interface of an apparatus for optical inspection of component carriers of an array during processing component carriers according to another exemplary embodiment of the invention.
Figure 5:
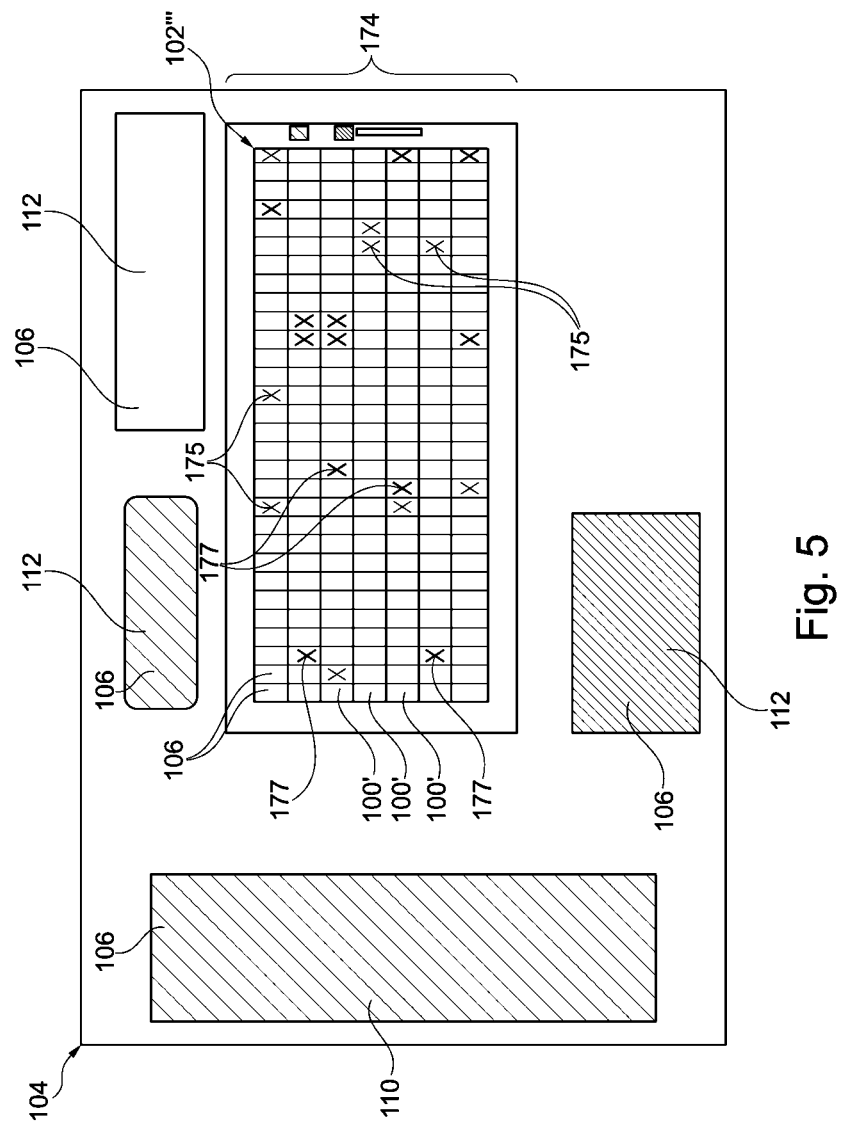
FIG. 5 illustrates a display and a user interface of an apparatus for optical inspection of component carriers of an array during processing component carriers according to still another exemplary embodiment of the invention.

The image of the array 102 together with its identification data derived from a corresponding data set 138 is then displayed on display 104, for instance a liquid crystal display (LCD) with touchscreen functionality. The captured image of the array 102 together with identifier information of the described system may be displayed on display 104, for instance in a way as shown in FIG. 3 to FIG. 5. The human operator 118 may inspect the array 102 on the display 104 and may confirm or reject the corresponding quality proposal made by quality classification proposal unit 124. In order to improve the (for instance neural network based) artificial intelligence system of the quality classification proposal unit 124, a data exchange between the quality classification proposal unit 124 and the user interface 106 may be advantageous, see feedback loop 148. For instance, it can be meaningful for learning of the self-adaptive neural network system of the quality classification proposal unit 124 in which cases a human operator 118 has accepted and in which cases the human operator 118 has refused the quality classification proposal.

As indicated by a communication line 150, the human operator 118 may exceptionally instruct the supply unit 122 to physically supply the array 102 for manual handling and touching by the human operator 118. For instance, the human operator 118 may make such an exceptional request for dedicated quality analysis of critical arrays 102 or component carriers 100. However, apart from such highly exceptional cases, the apparatus 120 works in a touchless way without manual handling of the arrays 102 by the human operator 118. Thereby, the risk of scratches or the like on the array 102 may be reduced. After the quality classification, the array 102 may proceed to the next or subsequent processing stage 144.

Figure 2:
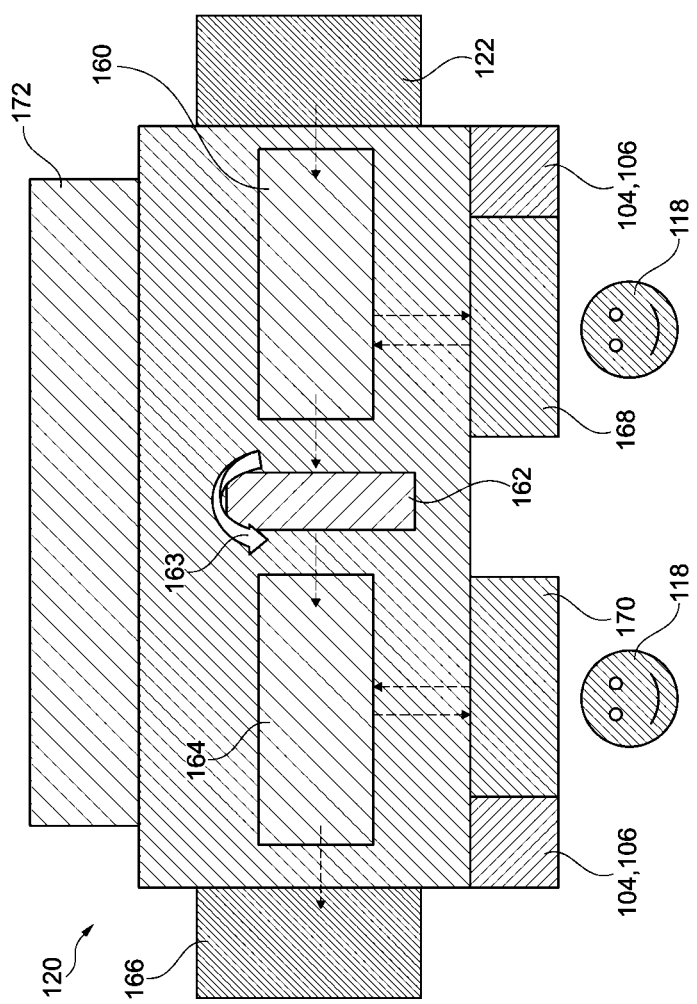
FIG. 2 illustrates a plan view of an apparatus for optical inspection of component carriers of an array during processing component carriers according to an exemplary embodiment of the invention.

FIG. 2 illustrates a plan view of an apparatus 120 for optical inspection of component carriers 100 of an array 102 during processing component carriers 100 according to an exemplary embodiment of the invention.

As shown in FIG. 2, the arrays 102 can be supplied to the apparatus 120 automatically by supply unit 122, i.e. a loader. The arrays 102 are then transported fully automatic to a first main table 160 and, after flipping (see reference sign 163) the arrays 102 by a flipper 162, to a second main table 164. When on the first main table 160, a human operator 118 can visually inspect an image of the array 102 via display 104 and may carry out a human based quality classification via user interface 106. A second operator 118 can do the same task when the array 102 lies on the second main table 164 and is displayed from a back side, on a further display 104. Via a further user interface 106, the second operator 118 may make a quality classification of the array 102 by backside inspection. Thereafter, the array 102 may be transported away from the apparatus 120 by an unloader 166. In an exceptional case, when the respective human operator 118, 118 needs to inspect the array 102 directly, the respective human operator 118, 118 may request the automatic handling system to put the array 102 physically on a respective working table 168, 170 for exceptional detailed inspection by the respective human operator 118, 118. However, in the majority of cases, the respective human operator 118, 118 carries out the quality classification without manually handling and touching the respective array 102. FIG. 2 furthermore shows, with reference numeral 172, a hook up and utilities of the apparatus 120.

As an alternative to the architecture shown in FIG. 2, the process can also be carried out by a single human operator 118 rather than by two cooperating human operators 118, 118. Thus, the described method can be carried out with one or two operators 118.

Flipper 162 can turn over an array 102 from one main table 160 to the other main table 162 or on the same table (for instance in a one-operator mode). In particular, a fully automated and touchless loader/unloader system may be provided. Such a system may be fully integrated in an electronic mapping system allowing for a tracing of each individual array 102 or component carrier 100 during manufacture. The illustrated apparatus 120 may have the ability to transfer an array 102 to the working tables 168, 170 for repair and/or for manual inspection. The illustrated apparatus 120 may ensure a shorter cycle time as compared to conventional approaches. Such an apparatus 120 may also be capable of preventing or at least suppressing human errors in a final inspection station for data input.

FIG. 3 illustrates a display 104 and a user interface 106 of an apparatus 120 for optical inspection of component carriers 100 of an array 102 during processing component carriers 100 according to an exemplary embodiment of the invention.

As illustrated in FIG. 3, it may be possible to display on the display 104 an array identifier 108, error codes 110, and one or more control fields 112, for instance for loading or unloading an array 102, for exceptionally manually handling an array 102, or for zooming an array 102.

More specifically, FIG. 3 shows a touchscreen interface for a human operator 118. On the left-hand side of the display 104, an array display area 174 is shown on which an image of an array 102 which is presently optically inspected may be displayed. Error codes 110 may be displayed as well, for instance as scarp code patterns. The array identifier 108 may show production data concerning the array 102 derived from the assigned code structure 136 in combination with the database 140, more specifically an assigned data set 138 thereof. Various control and operation buttons as well as loader and unloader controlling buttons may be displayed as control fields 112.

FIG. 4 illustrates details of a display 104 and a user interface 106 of an apparatus 120 for optical inspection of component carriers 100 of an array 102 during processing component carriers 100 according to an exemplary embodiment of the invention, FIG. 4 shows that it may be possible to display on array display area 174 of the display 104 an image 102' of the array 102 in which at least one component carrier 100 is marked with corresponding crosses as "identified to be defective" in previous processing stage 130 (see reference signs 175). In other words, image 102' reflects the fact that certain component carriers (see reference numeral 175) have already been identified as defective in previous processing stage 130. An image of a respective component carrier 100 which is not defective is denoted in FIG. 4 with reference sign 100'. In other words, an image of a respective defective component carrier 100 is denoted in FIG. 4 with reference sign 175, whereas an image of a non-defective, i.e. defect-free, component carrier 100 is denoted in FIG. 4 with reference sign 100'.

In addition, it may be possible to display on the display 104 a further image 102" of the same array 102 in which at least one component carrier 100 is marked with corresponding crosses as "automatedly proposed to be defective" in present processing stage 132 (see reference signs 177). Component carriers 100 marked in accordance with reference sign 177 of further image 102" are thus proposed by quality classification proposal unit 124 as potentially defective in present processing stage 132. A human operator 118 however still has the option to overrule this proposal.

It may also be advantageously possible to display on the display 104 said image 102' of the array 102 in which at least one component carrier 100 is marked as identified to be defective in the previous processing stage 130 overlaid or superposed with said further image 102" of the array 102 in which at least one component carrier 100 is marked as automatedly proposed to be defective in the present processing stage 132. The result of such an overlay or superposition of images 102', 102" is displayed as an additional image 102'''. In additional image 102''', all component carriers 100 considered defective in previous processing stage 130 (see reference sign 175) and all component carriers 100 considered defective in present processing stage 132 (see reference sign 177) are shown together in a very intuitive way in one common image 102'''. Images 100' of said component carriers 100 corresponding to reference signs 175 and corresponding to reference signs 177 may however still be visually distinguished in common image 102'''.

Descriptively speaking, FIG. 4 shows the display 104 in more detail. In particular referring again to array display area 174, the described three images 102', 102", 102''' of the array 102 and of the component carriers 100 (images shown as component carrier images 100') are illustrated here. In the upper portion of array display area 174, the image 102' of the array 102 is shown corresponding to a defect classification in previous processing stage 130. In previous processing stage 130, some of the electronic components 100 have already been classified as defective, as indicated by crosses 175. In a central portion of the array display area 174, image 102" of the array 102 is shown which corresponds to a defect proposal in the present processing stage 132. As shown by crosses 177, specific ones of the component carriers 100 have been proposed to be defective by the quality classification proposal unit 124. In the lowermost portion of the array display area 174, both the defective component carriers 100 as identified in the previous processing stage 130 (see crosses 175) as well as the component carriers 100 which are proposed to be classified as defective in the present processing stage 132 (see crosses 177) are overlaid in common image 102'''. Thus, the human operator 118 may focus, in his assessment of the quality classification on the component carriers 100 according to crosses 177. Since they have already been finally classified as defective, the human operator 118 may disregard for the quality assessment the component carriers 100 corresponding to crosses 175. The other component carriers 100, which are neither marked with a cross 175 nor with a cross 177 have been accepted by the apparatus 120 as pass, and this decision may be reviewed by the human operator only if desired or required in view of specific circumstances. Thus, in particular the image 102''' of the lower portion of array display area 174 is highly intuitive for a human operator 118 and significantly simplifies the human-based quality classification, which can thereby also be rendered more accurate. Thus, an improved yield and a reduced number of false quality classifications may be achieved.

As can be taken from FIG. 4, an array defect history may be taken into account, for instance by making use of electronic mapping data of previous inspection stations. An actual image from an array 102 showing potential new defects may be determined and displayed. Advantageously, there may be the option to zoom in each unit or component carrier 100 of an array 102. It may be possible to prevent showing previously scrapped units again which may result in a shorter cycle time and the prevention of double scrap issues. In a first section, a human operator 118 can zoom in on each machine suggested defect to see it better and then decide if it is a real defect to not. After defect confirmation by the human operator 118, the software-based system may ask the human operator 118 to assign a scarp code to this defect, for instance by making a selection from provided scrap codes buttons (see reference signs 110 in FIG. 3 and FIG. 4).

The two overlaid images 102' and 102" shown as further image 102''' in FIG. 4 show a combination of already confirmed failed units and potentially new failed units or component carriers 100. In the overlaid section corresponding to further image 102''', the system may show an overall defect mapping of the component carriers 100 of an array 102 and may ask the human operator 118 to confirm (or reject). The system may then automatically save this information, for instance in an XML file of a file server which may be used in a later process for laser marking of defective units or component carriers 100.

FIG. 5 illustrates a display 104 and a touchscreen-based user interface 106 of an apparatus 120 for optical inspection of component carriers 100 of an array 102 during processing component carriers 100 according to still another exemplary embodiment of the invention.

In the alternative display content shown in FIG. 5, the array display area 174 only shows the overlaid result from the previous processing stage 130 and the present processing stage 132, i.e. only shows image 102'''.

FIG. 6 illustrates a flowchart 200 of a method of processing component carriers 100 according to an exemplary embodiment of the invention.

FIG. 6 in particular shows a logical position of the apparatus 120 according to an exemplary embodiment of the invention in the entire process flow during processing the component carriers 100. An automatic visual inspection is carried out in a block 202 by a machine, i.e. in a fully automated way. This may be followed by a manual verification process, see block 204. After that, the apparatus 120 and the method, as described above, may be implemented and carried out. Thereafter, see block 206, defective component carriers 100 of an array 102 may be provided with a corresponding physical mark, for instance by laser marking. This may take place based on the finalized decision or consolidated data set on faulty component carriers that may be obtained in the process according to reference numeral 204. Thereafter, a cleaning procedure may be carried out in a block 208, for instance for removing burr. This may be followed by a baking procedure carried out in block 210. Such a baking procedure may be done for dewarping, deoxidizing and further cleaning the component carriers 100. Subsequently, see block 212, a vacuum packing procedure may be carried out.

FIG. 7 illustrates a flowchart 250 of a method of processing component carriers 100 according to another exemplary embodiment of the invention.

Now referring to FIG. 7, an overview over a smart automated final inspection system according to an exemplary embodiment of the invention will be given. A progress of a process flow can be taken from reference numeral 252. Descriptively speaking, advantageous aspects of said automated final inspection system is an automated touchless handling 254, an enhanced judgement inspection 256 as well as the utilization of an electronic mapping or traceability system 258. Operation of apparatus 120 and method according to an exemplary embodiment of the invention may involve a fully automated loading on a main table and a flipping to the second side, as indicated by reference numeral 260. Furthermore, it is advantageous to carry out a touchless inspection of both array sides with different magnifications, if desired. For instance, the magnifications may be in a range from 1 to 100. This is indicated schematically by a block 262. Furthermore, it is possible to overlay electronic mapping data with final inspection generated images and skip previous defective units, see block 264. As indicated by block 266, suggestions to a human operator may be based on artificial intelligence for obtaining an enhanced judgement function. Furthermore, there is a possibility for repairing, cleaning and carrying out a naked eye check, see block 268. As indicated by a block 270, it may become simplified to define scrapped component carriers or arrays, preferably using predefined defect codes. An output may update a corresponding electronic mapping file, see data sets 138 in database 140.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of processing component carriers with an apparatus, comprising:
   supplying a plurality of integrally connected bodies, each integrally connected body comprising a plurality of component carriers, to the apparatus for optical inspection of an image captured by the apparatus;
   displaying one of the plurality of integrally connected bodies on a display;
   providing a user interface enabling an input of a judgment concerning a quality classification of a displayed integrally connected body generated by the apparatus; and
   providing a default mode where manual handling of the displayed integrally connected body is fully disabled.

2. The method according to claim 1, further comprising: making an automated proposal concerning the quality classification as a basis for the judgment.

3. The method according to claim 2, further comprising: displaying the automated proposal to the human operator.

4. The method according to claim 1, comprising at least one of the following features:
   wherein the method comprises carrying out the quality classification to classify a respective individual component carrier or an entire integrally connected body as pass;
   wherein the method comprises carrying out the quality classification to classify a respective individual component carrier or an entire integrally connected body as fail;
   wherein the method comprises carrying out the quality classification to classify a respective individual component carrier or an entire integrally connected body as repairable or as to be repaired.

5. The method according to claim 1, further comprising: displaying an image of the integrally connected body on the display.

6. The method according to claim 5, further comprising: displaying on the display an image of the integrally connected body in which at least one component carrier is marked as identified to be defective in a previous processing stage.

7. The method according to claim 6, further comprising: displaying on the display an image of the integrally connected body in which at least one component carrier is marked as automatedly proposed to be defective in a present processing stage.

8. The method according to claim 7, further comprising: displaying on the display said image of the integrally connected body in which at least one component carrier is marked as identified to be defective in the previous processing stage overlaid with said image of the integrally connected body in which at least one component carrier is marked as automatedly proposed to be defective in the present processing stage.

9. The method according claim 1, wherein the optical inspection is carried out at a remote location, which differs from a processing location of the plurality of integrally connected bodies if identified as defective and repairable.

10. The method according to claim 1, further comprising: displaying on the display at least one of the group consisting of an integrally connected body identifier, defect codes, and a control field.

11. The method according to claim 1, further comprising: carrying out the quality classification so as to indicate a type of defect among a number of predefined types of defect for at least one of the component carriers or for an entire integrally connected body.

12. The method according to claim 1, further comprising: marking a respective component carrier or an entire integrally connected body based on the quality classification according to the judgment.

13. The method according to claim 1, comprising at least one of the following features:
   wherein the method comprises carrying out the optical inspection after separation of a panel into integrally connected bodies and before separation of the integrally connected body into individual component carriers;
   wherein the method comprises carrying out the optical inspection by handling the arrays in a touchless way;
   wherein the method comprises carrying out the optical inspection in combination with a traceability system in which each integrally connected body and/or each component carrier is provided with a readable code structure assigned to a related data set stored in a database for identifying each integrally connected body and/or each component carrier by an assignment between a respective code structure and a respective data set;
   wherein the judgment is at least one of a human-based judgment and a machine-based judgment.

14. An apparatus for optical inspection of component carriers of arrays, comprising:
   a supply unit configured for supplying a plurality of integrally connected bodies, each integrally connected body comprising a plurality of component carriers, to the apparatus for optical inspection of an image captured by the apparatus;
   a display configured for displaying one of the plurality of integrally connected bodies; and a user interface configured for enabling an input of a judgment concerning a quality classification of a displayed integrally connected body generated by the apparatus wherein the apparatus is configured to operate in a default mode where manual handling of the displayed integrally connected body is fully disabled.

15. The apparatus according to claim 14, further comprising:

a quality classification proposal unit configured for making a proposal concerning quality classification to be displayed to the human operator on the display as decision-making support for the judgment.

16. The apparatus according to claim 15, wherein the quality classification proposal unit is configured for making the proposal by applying artificial intelligence.

17. The apparatus according to claim 15, wherein the user interface is configured for enabling the human operator to selectively accept or overrule the proposal.

18. The apparatus according to claim 14, comprising at least one of the following features:

wherein the display comprises an input device for enabling the human operator to operate via the input device;

an optical detection unit configured for detecting image data of one of the plurality of integrally connected bodies to be optically inspected, wherein the image data is to be supplied to the display as a basis for displaying an image of the one of the plurality of integrally connected bodies; and at least one processor configured to display the one of the plurality of integrally connected bodies on a display.

19. A non-transitory program element for processing component carriers, which program element, when being executed by one or a plurality of processors, is adapted to carry out or control a method comprising:

supplying a plurality of integrally connected bodies, each integrally connected body comprising a plurality of component carriers, to an apparatus for optical inspection of an image captured by the apparatus;

displaying one of the plurality of integrally connected bodies on a display;

providing a user interface enabling an input of a judgment concerning a quality classification of a displayed integrally connected body generated by the apparatus; and providing a default mode, where manual handling of the displayed integrally connected body is fully disabled.

* * * * *